(12) United States Patent
Beck

(10) Patent No.: US 8,092,959 B2
(45) Date of Patent: Jan. 10, 2012

(54) MEANS FOR TRANSFERRING A PATTERN TO AN OBJECT

(75) Inventor: Marc Beck, Höör (SE)

(73) Assignee: Obducat AB, Malmo (SE)

( * ) Notice: Subject to any disclaimer, the term of this patent is extended or adjusted under 35 U.S.C. 154(b) by 1109 days.

(21) Appl. No.: 11/919,334

(22) PCT Filed: Apr. 13, 2006

(86) PCT No.: PCT/EP2006/061571
§ 371 (c)(1),
(2), (4) Date: Oct. 26, 2007

(87) PCT Pub. No.: WO2006/114369
PCT Pub. Date: Nov. 2, 2006

(65) Prior Publication Data
US 2009/0317727 A1    Dec. 24, 2009

(30) Foreign Application Priority Data
Apr. 27, 2005 (EP) ..................................... 05009188
Sep. 2, 2005 (EP) ..................................... 05108066

(51) Int. Cl.
*G03F 7/20* (2006.01)
(52) U.S. Cl. ............ 430/5; 430/322; 430/325; 430/326; 430/396; 355/67
(58) Field of Classification Search .......................... None
See application file for complete search history.

(56) References Cited

U.S. PATENT DOCUMENTS

| 5,928,815 | A  | * | 7/1999 | Martin ............................. 430/5 |
| 6,091,874 | A  |   | 7/2000 | Higashi et al. |
| 6,187,482 | B1 | * | 2/2001 | Kuroda et al. .................... 430/5 |
| 6,334,960 | B1 |   | 1/2002 | Wilson et al. |
| 6,764,367 | B2 |   | 7/2004 | Green et al. |
| 2004/0045932 | A1 |   | 3/2004 | Kochergin et al. |
| 2004/0090610 | A1 |   | 5/2004 | Hatakeyama et al. |
| 2004/0115568 | A1 | * | 6/2004 | Schmidt ....................... 430/326 |

FOREIGN PATENT DOCUMENTS

EP  1 001 311 A1  5/2000

(Continued)

OTHER PUBLICATIONS

Japanese Office Action in corresponding Japanese Patent Application No. P2008-508190 mailed Aug. 2, 2011 and English translation.

*Primary Examiner* — John A. McPherson
(74) *Attorney, Agent, or Firm* — Renner, Otto, Boisselle & Sklar, LLP

(57) ABSTRACT

A template (10) having a first surface (13, 14), usable for transferring a pattern of the first surface to an object (20) having a second surface (23) covered by a light-sensitive coating (22), by contacting the patterned first surface with the coating, wherein the template comprises a carrier base (11) of e.g. nickel, and a waveguide (14) is disposed on the carrier base at the first surface. The waveguide is devised to lead light therein, introduced at a radiation input, and to leak evanescent waves to portions (24) of the coating corresponding to said pattern. The template may also be devised with an opaque shield (15), disposed at the first surface over selected portions of the waveguide, which serves to define where the evanescent waves can leak to the coating. The invention also relates to a method and an apparatus for using the template, and a method for manufacturing it.

24 Claims, 6 Drawing Sheets

FOREIGN PATENT DOCUMENTS

| | | |
|---|---|---|
| JP | 2000-112116 | 4/2000 |
| JP | 2003-305700 | 10/2003 |
| JP | 2004-200664 | 7/2004 |
| WO | WO 2004/015662 A2 | 2/2004 |
| WO | WO 2005/052658 A1 | 6/2005 |
| WO | WO 2005/061379 A2 | 7/2005 |
| WO | WO 2005/061379 A3 | 7/2005 |

* cited by examiner

US 8,092,959 B2

MEANS FOR TRANSFERRING A PATTERN TO AN OBJECT

FIELD OF THE INVENTION

The present invention relates generally to the field of pattern transfer, in which a template having a patterned surface is placed in contact with an object surface on which a light-sensitive coating is disposed. Selected portions of the coating are then exposed to radiation for affecting the properties thereof, such that a pattern may be formed in the coating through a subsequent development process. More particularly, the invention relates to a template and an apparatus for use in such a process, as well as a process method for transferring a pattern, and a method for manufacturing a template suitable for that process.

BACKGROUND

Several techniques have been suggested for producing nanostructures, within the field of making e.g. hard drives and electronic circuits. One particular technique which has drawn a lot of attention in recent years is so-called nanoimprint lithography for producing nanostructures, i.e. structures in the order of 100 nm and smaller. In the main steps of such lithography, a pattern of nanostructures is transferred from a stamp to an object. The object comprises a substrate and, applied thereto, a film of e.g. a polymer material, often called resist. After heating of the film to a suitable temperature, the stamp is pressed into the film. The stamp is then released from the object when recesses of a desired depth have been formed in layer. Thereafter, any remaining film in the recesses is removed, for instance by etching, thereby exposing the substrate. In subsequent process steps, the pattern in the film is reproduced in the substrate or in some other material which is applied to the substrate.

A related lithographic technique is photolithography. A photolithographical process typically involves the steps of coating a substrate with a photoresist material to form a resist layer on a surface of the substrate. The resist layer is then exposed to radiation at selective portions, preferably by using a mask. Subsequent developing steps remove portions of the resist, thereby forming a pattern in the resist corresponding to the mask. The removal of resist portions exposes the substrate surface, which may be processed by e.g. etching, doping, or metallization. For fine scale replication, photolithography is limited by diffraction, which is dependent on the wavelength of the radiation used. For fabrication of structures on a scale of less than 50 nm, such a short wavelength is needed that the material requirements on the optical systems will be major.

A different form of lithography is radiation-assisted imprint, which has been presented as step and flash imprint lithography by Willson et al. in U.S. Pat. No. 6,334,960. Similar to the imprint technique briefly described above, this technique involves a template or stamp having a structured surface defining a pattern to be transferred to a substrate. The substrate is covered by a layer of polymerisable fluid, into which layer the template is pressed such that the fluid fills recesses in the pattern structure. The template is made from a material which is transparent to a radiation wavelength range which is usable for polymerising the polymerisable fluid, typically UV light. By applying radiation to the fluid through the template, and potential post-baking, the fluid is cured and solidified. The template is subsequently removed, after which the pattern thereof is replicated in the solid polymer material layer made from the polymerised fluid. Further processing transfers the structure in the solid polymer material layer to the substrate.

A problem related to radiation-assisted imprint is that either the template or the substrate has to be transparent to radiation of a wavelength usable for curing the polymer layer. This involves a limitation in selectable materials. When the purpose of the process is to provide a structure for e.g. electric circuits, the substrate is often made of silicon, or some other form of semiconductor material, which typically are opaque to UV radiation. This means that the template needs to be formed of a transparent material, such as quartz or $SiO_2$. However, such templates are expensive to produce, and they are also very sensitive to wear.

SUMMARY OF THE INVENTION

An object of the invention is to provide a method for transferring a pattern to an object, a template for such a process, an apparatus for carrying out the method, and a method for manufacturing such a template, which wholly or partly overcome the above problems of prior art. More specifically, it is an object to provide a solution for transferring a pattern of a template to an object having a light-sensitive coating, without being constrained to certain template or substrate materials.

According to a first aspect, this object is fulfilled by

BRIEF DESCRIPTION OF THE DRAWINGS

The invention and its advantages will be described in more detail below with reference to the accompanying schematic drawings which by way of example illustrate currently preferred embodiments of the invention. In the drawings.

DETAILED DESCRIPTION OF PREFERRED EMBODIMENTS

Figure 1:
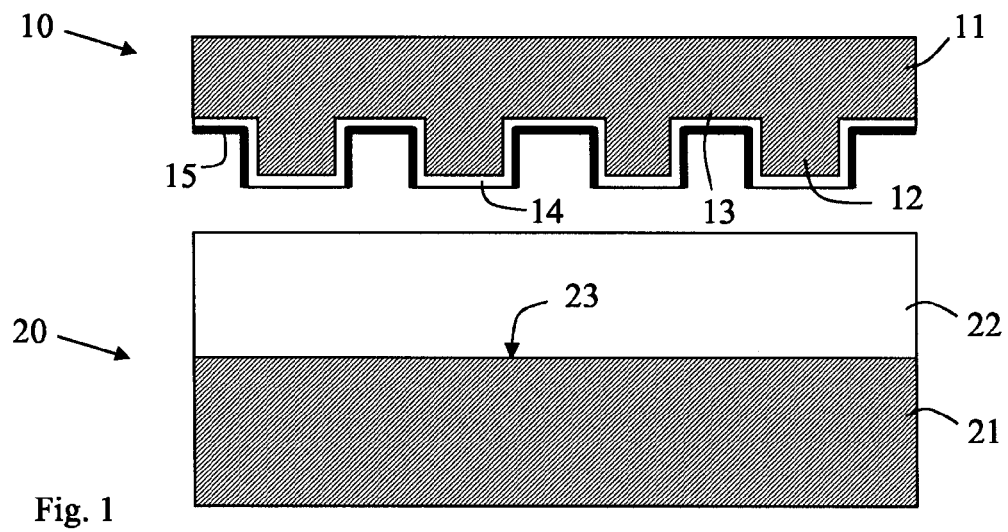
FIGS. 1-3 schematically illustrate a lithographic process for transferring a pattern of a structured template surface having a waveguide and an opaque shield, to an object having a light-sensitive negative resist coating, according to a first embodiment of the invention.

Before describing the detailed embodiments of the present invention, the principles of the invention will be considered. A major benefit of the nanoimprint technology is that ultra-fine patterns may be formed in a controlled process. When printing e.g. an integrated circuit on a substrate by use of nanoimprint lithography, different patterns are transferred to the substrate in successive steps by use of different stamps, with intermediate processing for defining conductive or insulating portions on the substrate. The use of light-sensitive resist layers and radiation exposure further provides the benefit that lithography can be made at a constant temperature. This means that thermal expansion problems between template and substrate will be minimised or even eliminated, whereby the reproducibility is improved, in particular for large area lithography.

The invention takes the use of radiation-assisted lithography on objects provided with light-sensitive coating layers to a new level, by making it applicable to a wider range of template and substrate materials. More particularly, the invention makes it possible to produce and use a metal template base, which as such is opaque to radiation. According to the invention, this advantageous effect is obtained by providing a template comprising a base structure, provided with a wave guide in the form of a layer or set of layers on a surface thereof. When the template is arranged with the wave guide placed in contact with the light-sensitive coating of the object, radiation is entered into the wave guide, from which the radiation leaks as evanescent waves in the near-field regime.

In classical optical microscopy, the spatial resolution is limited by diffraction to about half the optical wavelength $\lambda$, the Abbé limit. This limit arises because electromagnetic waves interacting with an object to be imaged are always diffracted into two components:
1) propagating waves with low spatial frequencies $<2/\lambda$, and
2) evanescent waves with high spatial frequencies $>2/\lambda$.

Classical optics is concerned with the far-field regime, where sub-wavelength features of the object to be imaged cannot be retrieved. However, by operating in the near-field regime, at a distance s typically less than $\lambda$, the Abbé limit can be surpassed. These phenomena are well known, and have been used in scanning near-field optical microscopy SNOM, providing nanometer resolution. An important feature of this technique, however, is to maintain a close distance s to the object to be monitored, since the evanescent waves are damped out rapidly. The field intensity I decreases strongly according to $I \sim s^{-4}$.

In a particular field of SNOM callad Photon Scanning Tunnelling Microscopy PSTM, a sharp optical fibre tip is used to probed the evanescent field above an object in which total internal reflection TIR is made to occur. Since every photon has a positional probability distribution, there will in each point of reflection in the object surface be a certain probability that the photon is positioned outside the surface of the object. Such photons will create an evanescent field, which is picked up by the optical fibre tip. The fibre is connected to some form of photon detector, and the surface can be scanned using e.g. a step motor. More information about near-field microscopy can be found in "Scanning probe microscopy and spectroscopy, methods and applications", Roland Wiesendanger, 1994, ISBN 0 521 41810 0.

The present invention makes use of the physics of near-field tunnelling from a surface, for the purpose of exposing a light-sensitive coating layer of an object. The objective behind this process is to affect the material of the light-sensitive coating by radiation, such that it is either cross-linked and solidified, or made subjective to development and removal.

Figure 2:
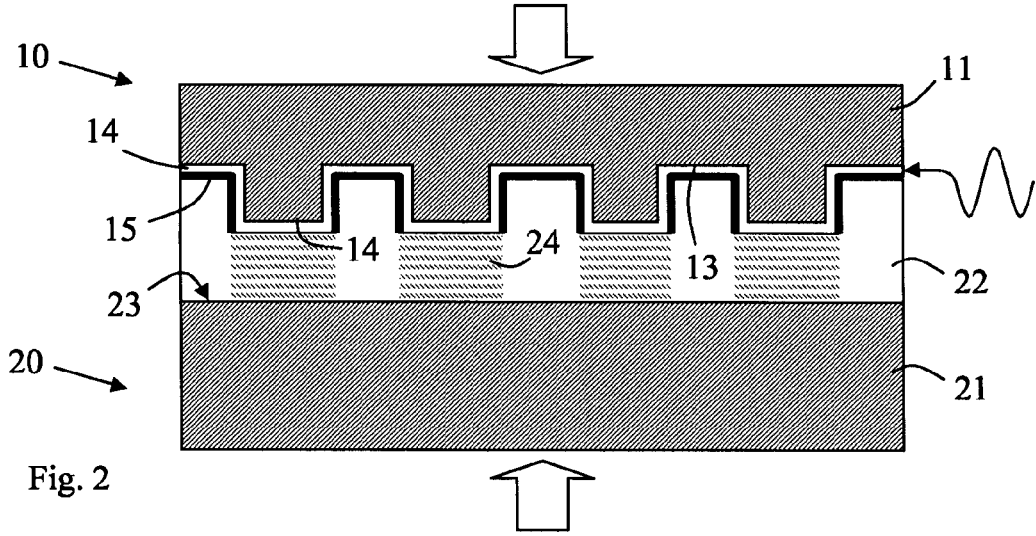
Figure 3:
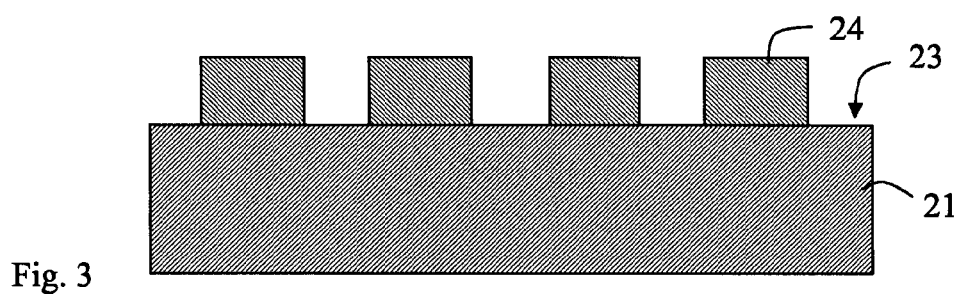

FIGS. 1-3 present a first embodiment of the invention. A template 10 comprises a carrier base 11 having a first surface, facing downwards in the drawing, on which a patterned structure is formed including projections 12 and recesses 13. The carrier base 11 may be made from any suitable material, but is preferably made from a metal material, such as nickel or aluminium, or from a semiconductor material such as silicon. The carrier base need not be of a single material, it may likewise comprise a layered structure, such as e.g. a silicon layer and a silicon dioxide layer, or a metal and a metal oxide layer. In particular nickel is material which is very well suited for producing templates, as is well known in the art.

On top of the first surface of the carrier base 11, a wave guide 14 is disposed. The wave guide 14 is made from a material which is transparent to at least a certain wavelength range, usable as described below. Preferably, the waveguide is at least transparent to ultra-violet (UV) light in the range of 200-400 nm. Usable materials for waveguide 14 are e.g. $SiO_2$, $Si_3N_4$, diamond, sapphire, and ITO. The waveguide 14 may be applied to the template surface by any of a number of known and suitable methods, such as thermal evaporation, chemical vapour deposition CVD, epitaxy or sputtering.

For an embodiment according to FIGS. 1-3, the actual dimensions of the structure of the patterned first surface of the template 10, will be determined by the dimensions of the projections 12 and recesses 13, as well as by the thickness of the waveguide 14. Preferably, the waveguide is disposed on the patterned first surface of template 10 to a thickness of no more than 10 nm, preferably not more than 5 nm. For such a thin waveguide, structures in the size of 100 nm or more may be made in the carrier base by electroplating or similar, without having to consider the added thickness from the waveguide 14. However, the dimensions of the carrier base surface structure may of course by formed with respect to the subsequently applied waveguide, such that the added dimensions of projections 12 and recesses 13, and waveguide 14, assume the desired size and shape.

In the embodiment of FIGS. 1-3, template 10 is further provided with an opaque shield 15, which covers wave guide 14 at recesses 13 and vertical wall parts of projections 12, whereas the outermost portions of waveguide 14 are unshielded. The opaque shield 15 may be only one or a few atomic layers, and is typically formed of a metal layer, e.g. of aluminium or gold. In an alternative embodiment (not shown), the wave guide 14 may be a net-like structure, which only covers said outermost portions of the projections 12. For such an embodiment, the opaque shield 15 may be dispensed with. For an embodiment with a net-like structure, it is preferred that the wave guide 14 is continuous, such that light may propagate from any part of the waveguide to another part thereof. Similar to the waveguide 14, the opaque shield may be provided in a number of known ways, such as those already mentioned.

Template 10 is placed opposite an object 20, comprising a substrate 21, having a second surface 23, on which a light-sensitive coating layer 22 is disposed. The substrate 21 may e.g. be made of silicon, GaAs, Ge, InP, or any other type of semiconductor material, or for instance a polymer or a metal. The light-sensitive coating 22 is made from a suitable resist material, adapted to alter its characteristics upon exposure to radiation of a selected wavelength, typically UV radiation in the region of 200-400 nm.

FIG. 2 illustrates a process step in which template 10 has been arranged with its patterned first surface placed in contact with coating 22, such that coating 22 adapts to the shape of the structured first surface, preferably by completely filling out recesses 13. Typically, this is performed by pressing the template 10 and the object 20 towards each other according to common practice, indicated in the drawing by the thick arrows. The template 10 is placed to a position as shown where the outermost portions of the projections 12 are located at a certain distance from the second surface 23. At this state, radiation is entered into waveguide 14, as is indicated by the wave-arrow in the drawing. Once light has been entered into waveguide 14, it will propagate by means of total internal reflection TIR throughout the waveguide 14. However, at the unshielded portions of projections 12, evanescent waves will leak out and expose the underlying coating 22 at selected underlying portions 24, which will be affected dependent on the type of resist material used for coating 22. FIGS. 1-3 illustrate the use of a negative resist material, which as such is devised to cure and solidify upon exposure to UV light. Examples of available and usable polymerisable or curable fluids for layer 22 comprise NIP-K17 and NIP-K22 from ZEN Photonics, 104-11 Moonj i-Dong, Yusong-Gu, Daejeon 305-308, South Korea. NIP-K17 has a main component of acrylate, and has a viscosity at 25° C. of about 9.63 cps. NIP-K22 also has a main component of acrylate, and a viscosity at 25° C. of about 5.85 cps. Both substances are devised to cure under exposure to ultraviolet radiation above 12 mW/cm$^2$ for 2 minutes. Another example of an available and usable polymerisable fluid for layer 22 is Ormocore from Micro Resist Technology GmbH, Koepenicker Strasse 325, Haus 211, D-12555 Berlin, Germany. This substance has a composition of inorganic-organic hybrid polymer, unsaturated, with a 1-3% photopolymerisation initiator. Viscosity is 3-8 mPas at 25° C., and the fluid may be cured under exposure of radiation with 500 mJ/cm$^2$ at a wavelength of 365 nm.

Since the process and template of FIGS. 1-3 are typically used for nanoimprint, the width of the projections 12 and recesses 13 may be less than 100 nm, even less than 10 nm. In these regions, the non-shielded portions at the projections 12 will defined apertures in the shield 15 to the waveguide 14, which apertures are smaller than the wavelength of the light entered into waveguide 14. For this reason, diffraction will block far-field propagating waves from escaping from wave guide 14, whereas evanescent waves may escape at the projections 12.

After exposure to radiation during a time period selected dependent on current process parameters, such as temperature and particularly the resist material used for coating layer 22, template 10 is removed from substrate 20. Post-baking may be performed at an elevated temperature to solidify the exposed portions 24 of coating layer 22, before or after separation from template 10. Once template 10 is removed, a developing process, such as a wet developing process, may be used to remove the coating layer 22 which has not been exposed to evanescent waves, to uncover substrate surface 23. Any traditional wet developing process may be employed, which is suitable for the material used in coating layer 22. After development, only the radiation-exposed portions 24 remain on the surface of the substrate 21, as illustrated in FIG. 3.

Dependent on the purpose of the process as described above, the distance between the outermost portions of the projections 12 and the substrate surface 23 may differ. If the purpose is to provide substrate 21 with projections 24 formed by the material of coating 14, and which are to remain as a part of a product, the distance is typically set dependent on how high those projections are to be. Such an embodiment may be where the object 20 is to be used as a pre-patterned surface for epitaxial growth. However, it must be noted that, as mentioned, the intensity of evanescent waves decays rapidly with distance. Even if the intensity of the evanescent waves may be increased by increasing the input radiation intensity, it may be difficult to produce structures higher than 20 nanometres. However, if the purpose of the remaining projections 24 are only to serve as a mask for either etching or plating of the substrate surface 23, the actual distance between the outermost portions of the projections 12 and the substrate surface 23 does not have to be more than perhaps 1-10 nm. Further processing of the substrate 21 will not be described any further, though, since the invention does not lie in aspects thereof.

Figure 4:
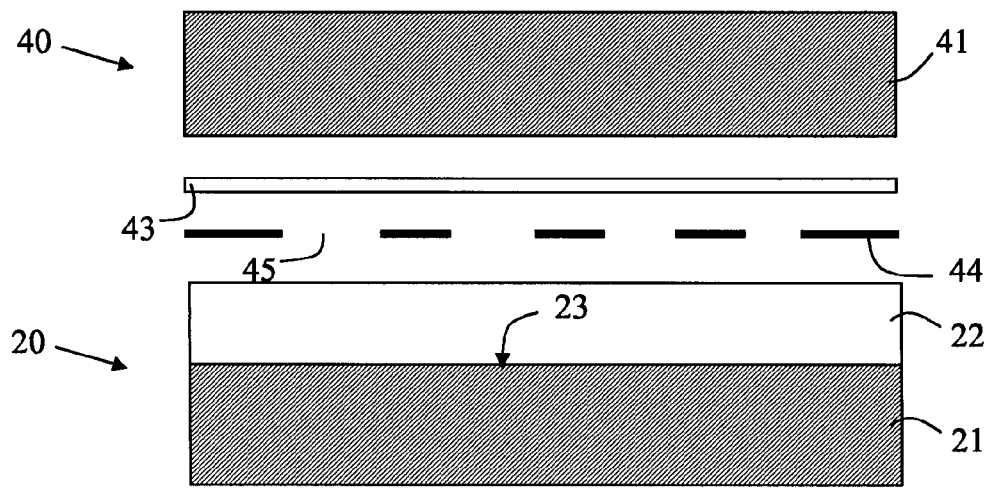
FIGS. 4-6 schematically illustrate a lithographic process for transferring a pattern of a non-structured template surface having a waveguide and an opaque shield, to an object having a light-sensitive negative resist coating, according to a second embodiment of the invention.
Figure 5:
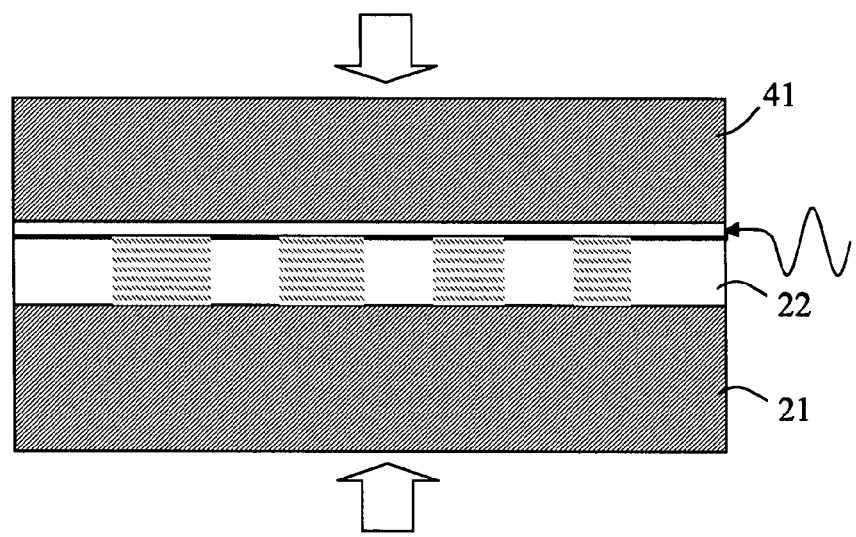
Figure 6:
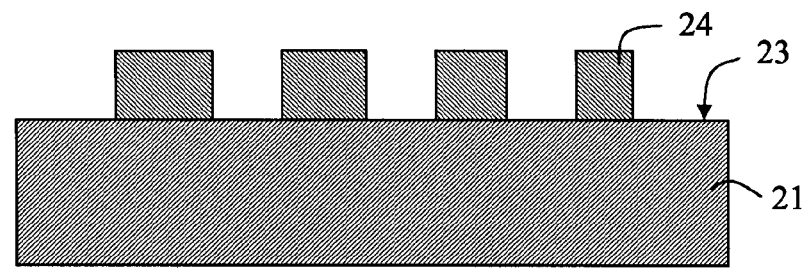

FIGS. 4-6 illustrate a second embodiment of the invention, in which a template 40 comprises a base carrier 41. Base carrier 41 has a flat surface 42, against which a waveguide 42 is disposed. An opaque shield 44 is further disposed over waveguide 43. FIG. 4 illustrates the three elements 41, 43, 44 of template 40 as separate objects. However, waveguide 43 may alternatively be attached to base carrier 41, e.g. by being grown thereon, and shield 44 may likewise be attached to waveguide 43 by being grown thereon. Materials and dimensions of carrier base 41, waveguide 43 and shield 44 may be as described in connection with FIGS. 1-3. Opaque shield 44 is further provided with apertures 45, which may have widths in the range of 5 nm to several hundred nm, or even smaller. The pattern of the template 41 is thus defined solely by the distribution and size of the apertures, and is therefore basically two-dimensional. Object 20, which faces the template 40, may be configured in the same manner as recited in connection with FIGS. 1-3.

FIG. 5 illustrates how template 40 and object 20 are pressed together, such that light-sensitive coating 22 is placed in contact with opaque shield 44. Light is entered into the waveguide 43, preferably UV radiation, which light will propagate within the waveguide 43, and leak evanescent waves through apertures 45 to the light-sensitive coating 22. Only those portions of the light-sensitive coating 22 which are present under the apertures 45 will thus be exposed to and affected by the radiation, as indicated.

FIG. 6 illustrates the object 20 after removal of the template and developing and removal of non-exposed parts of light-sensitive coating 22, similar to FIG. 3, with remaining portions 24 of the solidified light-sensitive coating material. As for the embodiment of FIG. 3, potential post-baking and wet development may be employed, dependent on the resist material used in the light-sensitive coating 22.

This second embodiment is simpler than the first embodiment, since the template is less complex. Furthermore, since there are no structures to be pressed into the light-sensitive coating 22, a lower pressure may potentially be used for keeping the template 40 and object 20 together in the step of FIG. 5.

Figure 7:
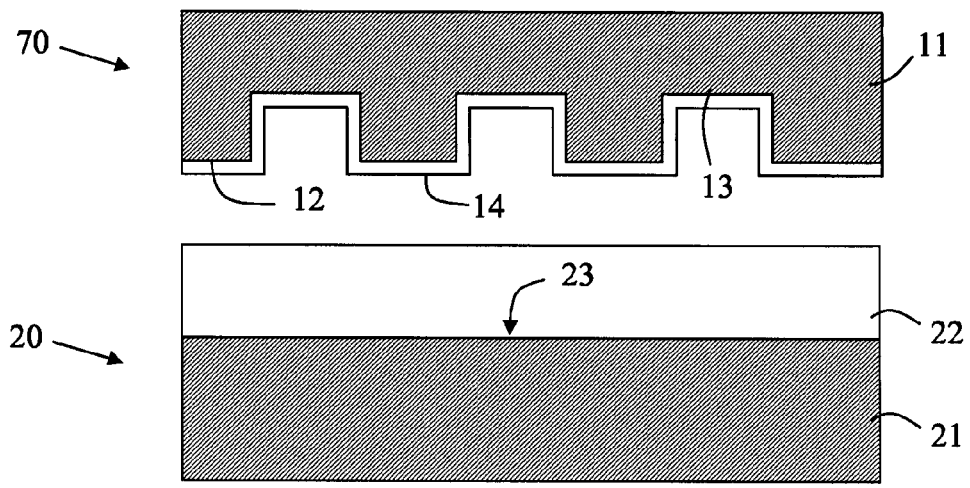
FIGS. 7-9 schematically illustrate a lithographic process for transferring a pattern of a structured template surface having a waveguide, to an object having a light-sensitive negative resist coating, for producing cavities in the object according to a third embodiment of the invention.
Figure 8:
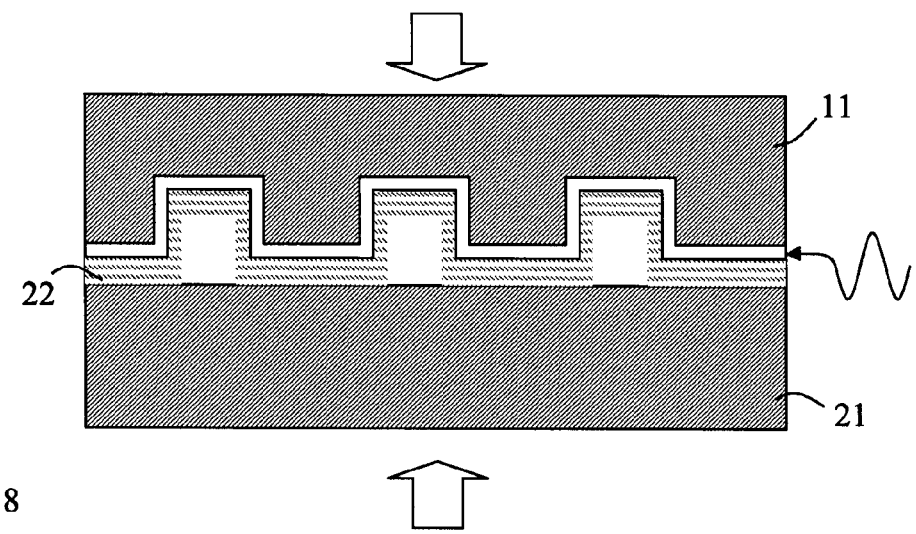
Figure 9:
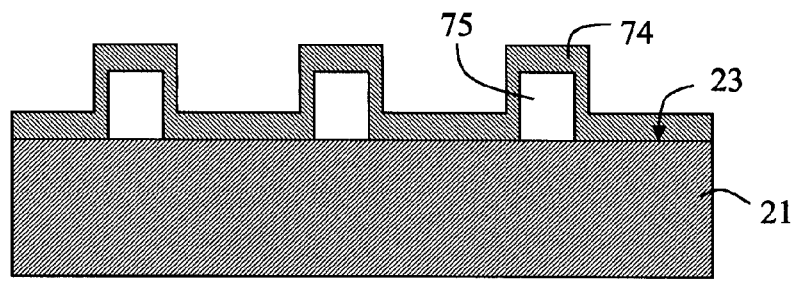

FIGS. 7-9 illustrate a third embodiment of the invention, usable for producing small size tubes or conduits, such as nano-tubes. Template 70 is similar to template 10 of FIG. 1, but without the opaque shield. The same reference numerals are therefore used for those features that are similar. Wave guide 14 is disposed over projections 12 and recesses 13 in the template surface of a barrier base 11. Object 20 may also be the same as that of FIG. 1.

In FIG. 8, template 70 is pressed against and into the light-sensitive coating 22 disposed on surface 23 of the substrate 21. Radiation is introduced in the wave guide 14, preferably UV light, which will propagate through wave guide 14.

However, since there is no shield present over waveguide 14, evanescent waves will leak out of waveguide all over its surface and affect the adjacent material of the light-sensitive coating 22, as illustrated in FIG. 8.

FIG. 9 illustrates, as for FIGS. 3 and 6, the object 20 after separation from template 70, potential post-baking, and development to remove non-exposed portions of the light-sensitive coating 22. Due to the shape of projections 12 and recesses 13, which are preferably shaped as channels in the template surface, the solidified remaining portions 74 of the light-sensitive coating 22, will encapsulate the conduits defined by the recesses 13, to produce tubes 75 in the surface 23 of the substrate. In order for this to be possible, it is of course important that radiation intensity distance between template and substrates surface, and dimensions of the projections 12 and recesses 13, are carefully matched, such that the entire light-sensitive coating 22 is not cured. Furthermore, the non-exposed portions close to the substrate surface 23 have to be accessible to developing fluid, in order to remove the non-exposed material to produce the hollow conduits or tubes 75. Materials and dimensions of the carrier base and the waveguide may be as described in connection with FIGS. 1-3.

Figure 10:
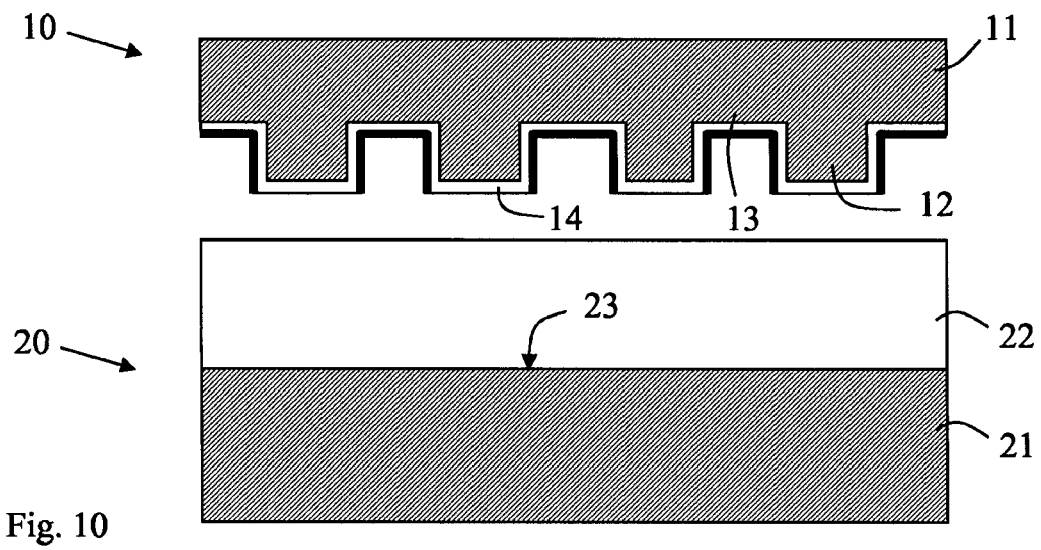
FIGS. 10-12 schematically illustrate a lithographic process similar to the embodiment of FIGS. 1-3, wherein the object has a light-sensitive positive resist coating.
Figure 11:
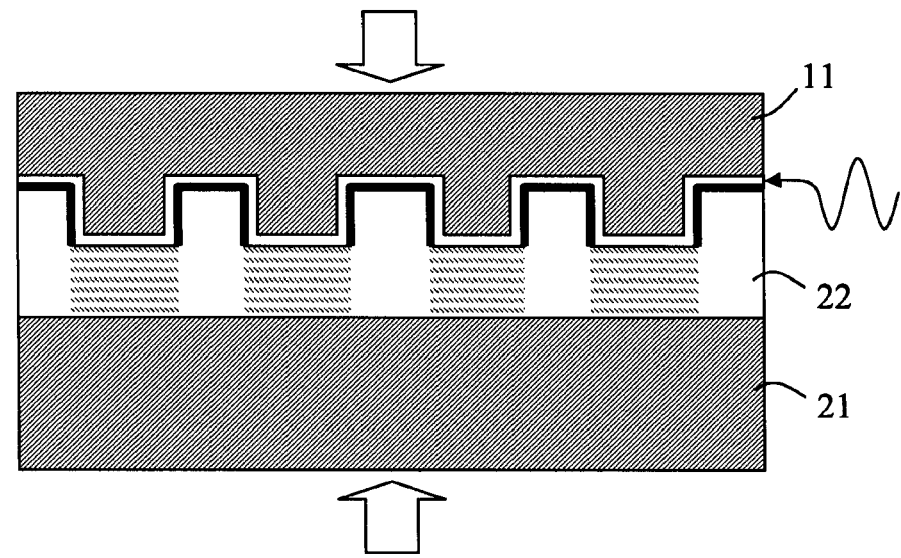
Figure 12:
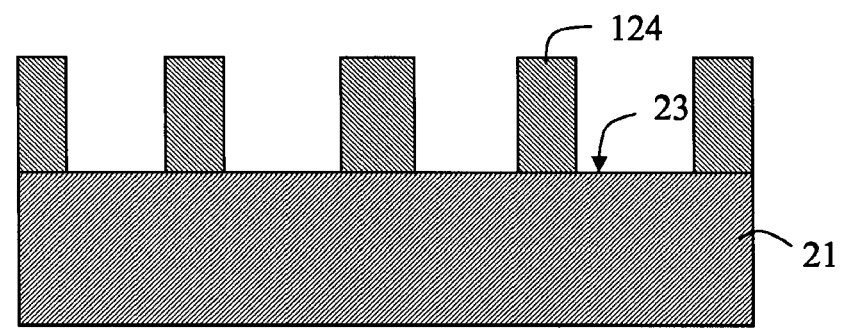

FIGS. 10-12 illustrates another embodiment, similar to FIGS. 1-3, and the same reference numerals are therefore also used for similar features. Materials and dimensions of carrier base 41, waveguide 43 and shield 44 may also be as described in connection with FIGS. 1-3. The main difference is that a positive resist material is instead used for the light-sensitive coating layer 22, such as e.g. Shipley 1800. The radiation process according to FIG. 11 therefore acts to make the exposed portions of the light-sensitive coating 22 soluble in a subsequent developing process. FIG. 12 illustrates the object after development, similar to FIG. 3, but in this case it is the portions 124 corresponding to the recesses which are remaining, the exposed portions of the coating preferably being removed in a wet developing process. Furthermore, the process indicated in FIGS. 10-12 produce a patterned surface 23 having a higher aspect ration than the template.

Figure 13:
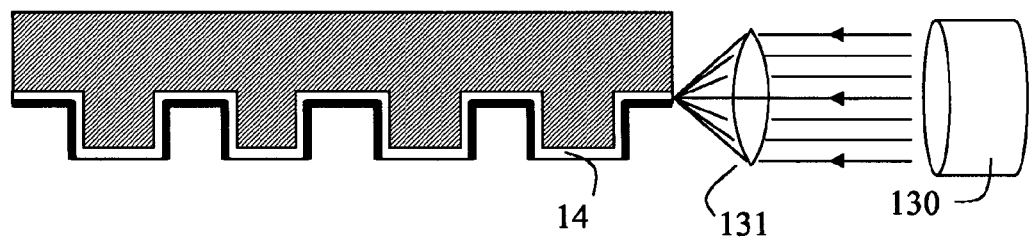
FIG. 13 schematically illustrates sideways light input into a template using a light source and a lens arrangement, according to an embodiment of the invention.

FIG. 13 illustrates one embodiment of how to introduce radiation into a waveguide 14, according to the invention, making use of a light source 130 and a lens arrangement 131, devised to focus light from light source 130 to a periphery portion of the waveguide 14, wherein a sideways facing surface portion of the waveguide 14 constitutes a radiation input. Light source 130 is typically devised to emit at least in the ultraviolet region below 400 nm. In a preferred embodiment, an air-cooled xenon lamp with an emission spectrum ranging from 200-1000 nm is employed as the radiation source 130. The preferred xenon type radiation source 130 provides a radiation of 1-10 $W/cm^2$, and is devised to flash 1-5 μs pulses, with a pulse rate of 1-5 pulses per second. A set of UV diodes may alternatively be used as a light source.

Figure 14:
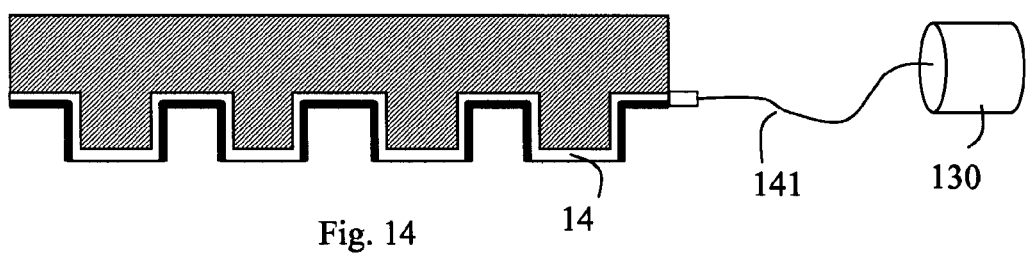
FIG. 14 schematically illustrates an alternative embodiment for sideways light input into a template, using a light source and an optical fibre arrangement.

FIG. 14 illustrates a different embodiment, in which light is coupled from light source 130 to waveguide 14 by means of an optical fibre connection 141. Such means for coupling light into the waveguide are preferred for light sources in the form of diodes, such an array of UV diodes. The optical fibre is connected to the waveguide, preferably a side surface portion of the waveguide 14, wherein the point of connection of the optical fibre constitutes a radiation input to the waveguide.

Figure 15:
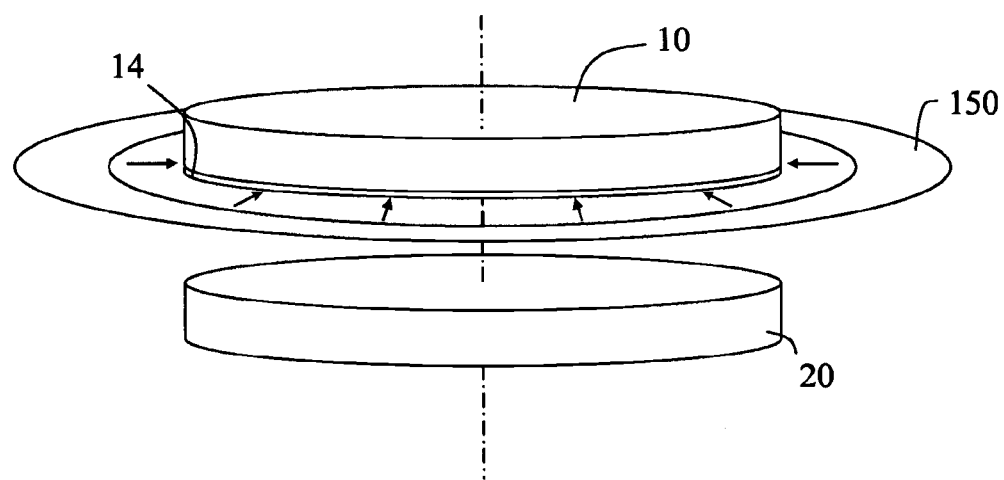
FIG. 15 schematically a lithographic setup with a template and an object to be patterned, where a light source is arranged circumferentially around a periphery portion of the waveguide provided on the template, for inputting light therein, according to an embodiment of the invention.

FIG. 15 illustrates schematically how a light source 150 is disposed annularly around a circular template 10, and devised to input radiation radially into waveguide 14. Light source 150 may include one xenon lamp or a plurality of UV diodes. Preferably, light source 150 also includes means for coupling light into a periphery portion of wave guide 14, such as a lens arrangement according to FIG. 13, or one or more optical fibres according to FIG. 14.

Figure 16:
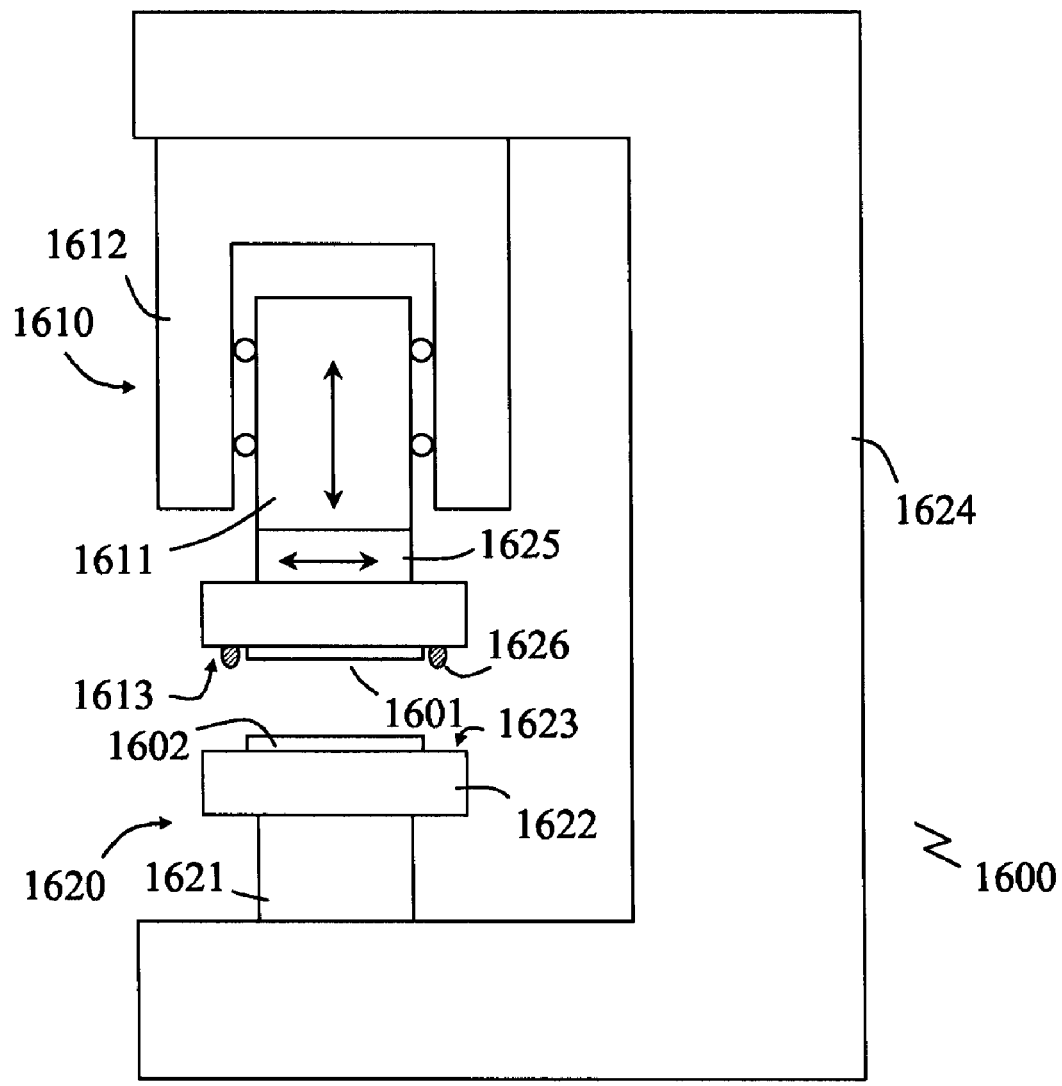
FIG. 16 shows a schematic view of an apparatus according to an embodiment of the invention.

FIG. 16 is a schematic view of an apparatus 1600 according to an embodiment of the invention. The apparatus, which is intended to transfer a pattern from a template 1601 devised with a waveguide (not shown) according to an embodiment of the invention, to an object 1602 devised with a light-sensitive coating, comprises a press 1610 and an abutment 1620 co-acting with the press. The press 1610, which can be of a prior-art type, such as a hydraulically operated press, has a piston element 1611 which is movable back and forth in a well-defined direction relative to a fixedly arranged body 1612 of press 1610. The piston element 1611 has on its side facing away from body 1612 a surface 1613 for receiving the template 1601. Abutment 1620 comprises a base 1621 and a holder 1622, which on its side facing away from the base 1621 has a surface 1623 for receiving the object 1602. A locking means (not shown) for securing the object 1602 is arranged at the surface 1623. This locking means can be of an arbitrary kind, but for automatic production it is preferable to use sub-atmospheric pressure in this securing of the object. A similar locking arrangement is preferably employed for holding the template 1601 to surface 1613. Body 1612 of press 1610 and base 1621 of abutment 1620 are supported by a chassis 1624.

In accordance with the invention, a light source 1626 is devised adjacent a periphery portion of template 1601, preferably in the form of a annular xenon lamp or an annular array of UV light-emitting diodes. Light source 1626 further comprises light coupling means, such as a lens arrangement for focusing light from the lamp towards the periphery portion of the waveguide, or optical fibres connecting light from the UV light-emitting diodes to the periphery portion of the waveguide. The apparatus 1600 is devised to be operated in accordance with any of the embodiments described in conjunction with FIGS. 1-12, by placing the template 1601 and the object 1602 in contact with each other, and preferably pressing them together, and driving light source 1626 to input radiation into the waveguide of template 1601 for affecting the property of selected portions of the light-sensitive coating on object 1602 by leaking evanescent waves thereto from the waveguide, which selected portions correspond to the surface pattern of template 1601.

The invention claimed is:

1. A template having a first surface, usable for transferring a pattern of the first surface to an object having a second surface covered by a light-sensitive coating, by contacting the patterned first surface with the coating, the template comprising a carrier base, and a waveguide layer disposed on the carrier base at the first surface, the waveguide layer being devised to lead light therein and to leak evanescent waves to portions of the coating corresponding to said pattern, and wherein the first surface comprises a structure with projections and recesses, on which structure the waveguide layer is disposed, the template being adapted for pressing the projections into the coating such that the coating fills up the recesses.

2. The template of claim 1, wherein an opaque shield is disposed at the first surface over selected portions of the waveguide layer.

3. The template as recited in claim 2, characterised in that the opaque shield forms the pattern of the first surface.

4. The template as recited in claim 1, wherein an opaque shield is disposed on the waveguide layer at the recesses.

5. The template of claim 1, wherein the light-sensitive coating is made of a negative resist material.

6. The template of claim 1, wherein the light-sensitive coating is made of a positive resist material.

7. The template as recited in claim 1, wherein the carrier base is made of a metal material.

8. The template as recited in claim 7, characterised in that the carrier base is made of nickel.

9. The template of claim 1, wherein the waveguide layer is made of a material selected from $SiO_2$, $Si_3N_4$, diamond, sapphire or ITO.

10. The template of claim 1, wherein the waveguide layer has a thickness of not more than 5 nm.

11. An apparatus for transferring a pattern from a template, the apparatus comprising the template of claim 1; a light source for exposing the coating to radiation; means for exposing the coating to evanescent waves from the waveguide layer to affect a property of selected portions of the coating; and means for pressing the protections into the coating such that the coating fills up the recesses.

12. The apparatus as recited in claim 11, characterised in that the light source is devised to introduce light into the waveguide layer at a periphery portion of the template.

13. The apparatus as recited in claim 12, characterised in that the light source is ring-shaped.

14. The apparatus as recited in claim 11, characterised in that the light source is devised to emit UV radiation.

15. The apparatus as recited in claim 11, characterised in that the light source comprises an array of UV diodes.

16. The apparatus as recited in claim 11, characterised in that a lens arrangement is devised to couple radiation from the light source to a radiation input of the waveguide layer.

17. The apparatus as recited in claim 11, characterised in that an optical fibre arrangement is devised to couple radiation from the light source to radiation input of the waveguide light source.

18. A method for transferring a pattern from a template having a patterned first surface, to an object having a second surface covered by a light-sensitive coating, wherein the first surface comprises a structure with protections and recesses, on which structure a waveguide layer is disposed, the method comprising the steps of:

placing the patterned first surface in contact with the coating;

introducing light into the waveguide layer disposed at the first surface;

exposing the coating to evanescent waves from the waveguide layer to affect a property of selected portions of the coating, and pressing the projections into the coating such that the coating fills up the recesses.

19. The method as recited in claim 18, further comprising the steps of: separating the template from the object; removing material from the coating in a development process dependent on said property, to create a three-dimensional structure corresponding to the selected portions in the coating.

20. The method as recited in claim 19, further comprising the step of: exposing selected areas of the second surface in the development process.

21. The method as recited in claim 18, wherein the light-sensitive coating is made of a negative resist material, the method further comprising the steps of: hardening the selected portions by the exposure to the evanescent waves; and removing non-hardened portions in a development process.

22. The method as recited in claim 18, wherein the light-sensitive coating is made of a positive resist material, the method further comprising the steps of: making the selected portions soluble in a development process, by the exposure to the evanescent waves; and removing the soluble portions in a development process.

23. The method as recited in claim 18, wherein an opaque shield is disposed on the first surface over the waveguide, the method further comprising the step of: guiding the evanescent waves from the waveguide layer through apertures in the opaque shield to the selected portions of the coating.

24. The method as recited in claim 18, wherein UV radiation is introduced in the waveguide layer.

* * * * *